US012813337B2

(12) United States Patent
Lang

(10) Patent No.: US 12,813,337 B2
(45) Date of Patent: Nov. 24, 2026

(54) MIRROR DISPLAY AND METHOD OF MANUFACTURE THE SAME

(71) Applicant: ams-OSRAM International GmbH, Regensburg (DE)

(72) Inventor: Erwin Lang, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 665 days.

(21) Appl. No.: 18/267,920

(22) PCT Filed: Dec. 10, 2021

(86) PCT No.: PCT/EP2021/085298
§ 371 (c)(1),
(2) Date: Jun. 16, 2023

(87) PCT Pub. No.: WO2022/128819
PCT Pub. Date: Jun. 23, 2022

(65) Prior Publication Data
US 2024/0006385 A1 Jan. 4, 2024

(30) Foreign Application Priority Data
Dec. 17, 2020 (DE) ..................... 10 2020 134 035.4

(51) Int. Cl.
*H10W 90/00* (2026.01)
*H10H 20/01* (2025.01)
(Continued)

(52) U.S. Cl.
CPC .......... *H10W 90/00* (2026.01); *H10H 20/841* (2025.01); *H10H 20/857* (2025.01); *H10H 20/034* (2025.01); *H10H 20/0364* (2025.01)

(58) Field of Classification Search
CPC ............... H10H 20/841; H10H 20/852; H10H 29/8421; H01L 25/0753; H10W 90/00
See application file for complete search history.

(56) References Cited

U.S. PATENT DOCUMENTS 11,579,182 B1 * 2/2023 Brodoceanu ........... G01R 31/27
2016/0351539 A1 12/2016 Bower et al.
(Continued)

FOREIGN PATENT DOCUMENTS

WO 2014/030830 A1 2/2014
WO 2020/137213 A1 7/2020

OTHER PUBLICATIONS

International Search Report issued for corresponding International Patent Application No. PCT/EP2021/085298 on Apr. 13, 2022, along with an English translation (5 pages).
(Continued)

*Primary Examiner* — Antonio B Crite
(74) *Attorney, Agent, or Firm* — Hauptman Ham, LLP

(57) ABSTRACT

A mirror display includes a mirror surface having a mirror layer with a first plurality of spaced apart recesses. The mirror display also includes a second plurality of optoelectronic components disposed on a drive layer having at least leads for driving the optoelectronic components. The mirror layer is arranged in an electrically insulated manner on the drive layer. In a top view of the mirror surface, in each case at least one optoelectronic component of the second plurality is arranged in a recess of the first plurality, the emission surface of which projects beyond the mirror surface.

19 Claims, 4 Drawing Sheets

(51) Int. Cl.

| | |
|---|---|
| ***H10H 20/841*** | (2025.01) |
| ***H10H 20/857*** | (2025.01) |
| ***H10H 29/30*** | (2025.01) |
| ***H10H 29/80*** | (2025.01) |

(56) References Cited

U.S. PATENT DOCUMENTS

| | | | | |
|---|---|---|---|---|
| 2019/0096831 | A1* | 3/2019 | Su | H01L 21/4853 |
| 2020/0023778 | A1 | 1/2020 | Park et al. | |
| 2020/0089057 | A1* | 3/2020 | Watanabe | G02B 6/0073 |
| 2020/0400982 | A1* | 12/2020 | Kobayashi | G02F 1/1339 |
| 2021/0020619 | A1* | 1/2021 | Iguchi | H01L 25/0753 |
| 2021/0296604 | A1* | 9/2021 | Lim | H10K 59/38 |

OTHER PUBLICATIONS

Written Opinion issued for corresponding International Patent Application No. PCT/EP2021/085298 on Apr. 13, 2022 (7 pages).

* cited by examiner

MIRROR DISPLAY AND METHOD OF MANUFACTURE THE SAME

CROSS REFERENCE TO RELATED APPLICATION

This application is a National Stage of International Application No. PCT/EP2021/085298, filed on Dec. 10, 2021, which designates the United States and was published in Europe, and which claims priority to German Patent Application No. 10 2020 134 035.4, filed on Dec. 17, 2020, in the German Patent Office. All of the aforementioned applications are hereby incorporated by reference in their entireties.

The present invention relates to a mirror display and a method of manufacturing the same.

BACKGROUND

For some applications, for example in the automotive field, a mirror is also intended to simultaneously integrate a display. This allows, for example, information to be presented to a user in a mirror so that the user can react to it in a suitable manner. In the case of such integrated displays with an additional mirror function, however, it is necessary to keep the energy consumption of the integrated display and thus also the associated power dissipation and heat generation as low as possible. At the same time, the display should also be clearly legible and visible when light falls on the mirror. Accordingly, users demand higher brightness levels for the display than would be necessary for standard displays in the automotive sector.

Conventional solutions in this context often work with partially transparent mirrors, whereby the display must be operated in the background with a significantly higher brightness in order to achieve the required brightness for the viewer. This requires a higher power consumption and thus a higher thermal load.

A typical application is realized, among others, by the mirror of "https://www.gentex.com/files/Aftermarket-FDM-Flyer.pdf", where it is possible to switch back and forth between a mirror function and the display mode. For use as a car interior mirror, it is thus possible to switch between a "mirror" mode and a "display" mode. In the former, such a display is used like a mirror, so that the rear of a vehicle can be observed via the mirror. In display mode, on the other hand, the content of a camera or other information is shown on the display.

However, there is a need to create a mirror display with sufficient brightness, low power consumption and a good mirroring function.

SUMMARY OF THE INVENTION

The inventor has realized that, in contrast to conventional mirrored displays, it is possible to realize a combination of mirror and display without having to sacrifice the other functionality. In doing so, the fact is exploited that the perceived luminance of actual optoelectronic components, or light-emitting diodes, is quite large compared to their actual surface area. In other words, it is thus possible not to have to place pixels in a display very closely in order to still obtain the impression of a completely luminous surface. This makes it possible to realize a display that can serve as a conventional mirror on the one hand, but on the other hand can also display information, images or similar. By using μ-LEDs, a very high intensity can be achieved on a small area, so that such a display can be easily seen even in bright surroundings. By using μ-LEDs, the power consumption is reduced and also the mirror function is not or only insignificantly affected.

The application thus proposes a mirror display having a mirror surface comprising a mirror layer having a first plurality of spaced apart recesses. A second plurality of optoelectronic components is disposed on a drive layer. The drive layer has at least supply lines for driving the optoelectronic components. In a top view of the mirror surface, at least one optoelectronic component of the second plurality is arranged in a recess of the first plurality.

The recesses do not create a mirror with a continuous surface, but rather a mirror matrix in which recesses or openings (i.e., non-mirroring areas) alternate with mirroring areas. The size of the recesses or openings is, however, very small compared to the area of the reflective areas and the areas surrounding the openings, so that they are not or hardly noticeable to a user and do not have a disturbing effect.

For example, a recess can be in the range of a few μm, for example in the range of 10 μm to 50 μm or even only between 10 μm to 30 μm. This results in an area of between 100 $\mu m^2$ and 2500 $\mu m^2$ or 900 $\mu m^2$. Compared to a normal rear-view mirror in a motor vehicle of approximately 20 cm×6 cm with 600×200 pixels, the total area of the recesses is approximately 300 $mm^2$ compared to a total area of 14000 $mm^2$. This is in the range of 2%. Thus, in some aspects, a total area of all recesses is less than 10% of the mirror area, and in particular is in the range of 0.5% to 3% of the total mirror area. In some aspects, the pixel density is said to be in the range of 150 ppi to 200 ppi or even greater than 200 ppi. in other applications, the size of a recess is in the range of 10 μm, and the size of a pixel in some aspects is in the range of 100 μm to 150 μm edge length.

The optoelectronic semiconductor components may be μ-LEDs. μ-LEDs are optoelectronic components with a very small edge length, generally in the range of a few μm to a few 10 μm. They are characterized by high luminosity combined with low power consumption and associated low heat output.

In some aspects, the recess is configured such that three optoelectronic components are arranged therein. These three optoelectronic components can generate light of different colors during operation, so that all colors can be mixed with them. In such a case, the second plurality corresponds to approximately three times the first plurality. Alternatively, a recess can be provided for each optoelectronic component so that the first plurality is approximately equal to the second plurality. The recesses can be arranged in rows and columns. Alternatively, they can follow the shape of the mirror surface, which may result in slightly different geometries.

The optoelectronic components may each be grouped together. In some aspects, three recesses are each grouped such that a distance from each other is less than a distance from an adjacent group of three recesses. Such grouping may be in a row, for example, but may also be in the form of a triangle, where in one aspect the centers of the components form the apexes of the triangle. In this way, three optoelectronic components can each form a pixel of the mirror display.

Other aspects relate to the geometric configuration and position of the mirroring surface with respect to the optoelectronic components. The term used above of a component in a recess is to be understood as meaning that a user can or could recognize the component in the arrangement when looking in the direction of the mirror display, and the component is at least partially exposed. Thus, a user sees the recess and the component. However, the component may be above, in, or below the recess when viewed from a side.

In some aspects, this means that in plan view, the optoelectronic components arranged in the first plurality of recesses are located behind the mirror layer, i.e., are further away from a user than the mirror layer. The mirror layer is thus in front of the components, so that they shine through the recesses. In another embodiment, the optoelectronic components arranged in the first plurality of recesses lie at least partially in the plane of the mirror layer in plan view. In other words, the emissive surface of the optoelectronic components may be approximately flush with the mirror surface, resulting in a substantially planar surface. The mirror layer and emissive surface would therefore be approximately equidistant from a user. Again, in some other aspects, it may be provided that the emission surface slightly overhangs the surface, and the optoelectronic components therefore project beyond the mirror layer and are thus closer to the user.

At this point, it should be noted that by the term emission area is meant the area that is perpendicular to the desired main radiation direction. The optoelectronic component can be designed as an area emitter or as a volume emitter. In both cases, however, a main emission direction is given (e.g. the direction from which a user looks at the mirror display), so that the area of the component on which the user looks defines the emission area.

A planarization layer can be provided, which is arranged between the mirror layer and the optoelectronic components. This allows the mirror layer to be spaced from the emission surface, providing another degree of freedom in design. In particular, a planarization layer can be used to compensate for any height differences. Areas between the optoelectronic components on the drive layer can be either black, i.e. absorbing, or reflective. Depending on the desired application, crosstalk is reduced in this way. A further panarization layer can thus extend over the optoelectronic components. In another aspect, an additional layer may also be disposed over the mirror layer.

In some aspects, an emission area of the at least one optoelectronic component disposed in the recess is less than the area of the recess. However, this is not mandatory. Likewise, in principle, the recess may be the same size or even smaller than the emission area of the at least one optoelectronic component disposed in the recess. In such a case, the component would be fully illuminated. Such an arrangement has the advantage that the entire recess always counts as the illuminating area. In addition, the requirements for the size of the component can also be reduced somewhat.

In addition to the layers already mentioned, the mirror display may comprise further layers serving different purposes and having corresponding functionalities. For example, in one aspect, a filler material is provided that at least partially fills the recess so that a surface of the mirror layer is planarized. In addition, transparent protective layer (s) may be provided, in particular made of a plastic or also of glass, which are arranged in front of the mirror layer in plan view. These protect the mirror display from damage or scratching of the mirror layer. Furthermore, it is possible to accommodate in these additional layers further functionalities such as dimming function by an electrochromatic layer in top view in front of the mirror layer on or in the glass.

In another embodiment, the proposed mirror display additionally comprises a partially transparent mirror layer, which is arranged on the mirror layer and the recesses in top view. Such a partially transparent mirror layer has proven to be useful for further improving the mirror impression, i.e. reducing the impression of peripherally arranged recesses that otherwise influence the visual impression under certain conditions. At the same time, the partially transparent mirror layer still allows sufficient light from the optoelectronic components to pass through the partially transparent layer. A partial transparency in the range of 70% to 90% has proven to be appropriate.

Another aspect relates to the design and arrangement or position of the drive layer with respect to the mirror layer and the optoelectronic components. In one aspect, the mirror display comprises a carrier substrate on which the drive layer is disposed. In some embodiments, the drive layer is disposed between the mirror surface and the optoelectronic components in a top view of the mirror surface.

In some aspects, a third plurality of transparent regions or openings are disposed in the drive layer corresponding to the recesses in a top view of the mirror surface. The optoelectronic components are arranged behind these transparent regions in plan view, so that in operation they radiate through the transparent regions of the drive layer and also through the recesses of the mirror layer. In some aspects, the carrier substrate also forms a protective layer, and is thus transparent in design and is located in front of the mirror layer when viewed from above.

As mentioned above, the drive layer can comprise other electronic components in TFT technology for supplying the optoelectronic components in addition to supply lines. This allows the drive layer and thus at least part of the supply electronics, e.g. controllable current sources, to be included and still require only a small amount of additional space.

The applications for such a mirror display are numerous. A typical application is in the automotive field, where the proposed mirror display can be used as a rearview mirror. Exterior mirrors can also be additionally equipped with such displays, in order to be able to show information if necessary. Simple applications can include taxi meters or rear-view cameras in which only parts of the mirror are equipped with a display. Another area of application is mirrors in the service sector, e.g. for trying on clothes, hairdressing or make-up. There, for example, clothing, make-up or an accessory can be projected over a person's face or body, so that an additional virtual fitting option is created for the user here.

Another aspect relates to a method for generating such a mirror display according to the proposed principle. A carrier substrate, in particular a transparent carrier substrate, and a plurality of optoelectronic components are provided. A drive layer is created with the plurality of optoelectronic components, so that optoelectronic components are placed at dedicated positions of the drive layer and are electrically connected to leads of the drive layer.

Thus, in a first step, a display, in particular a μ-display with a plurality of μ-LEDs arranged in rows and columns or in another predefined shape can be generated. This display can be created separately and independently from the following steps, but the following step can still be part of the manufacturing process of the display. In a next step, a mirror surface is formed with a mirror layer and a plurality of recesses so that each of the optoelectronic components is arranged in one of the plurality of recesses in a top view.

In this manner, a display is created that has both a mirror function through the mirror layer and a dis-play function through the light emitting diodes provided in recesses in the mirror layer. In one aspect, the step of forming a driving layer comprises forming a driving layer on the supporting substrate using thin film technology processes to generate leads and a plurality of contact pads. In addition, other electronic components, passive or active components can also be formed in the drive layer. The drive layer can be fabricated separately and then transferred to the carrier substrate using a transfer process. Then, the optoelectronic components are placed on the plurality of contact pads so that a main emission area of the semiconductor optoelectronic components faces away from the drive layer.

In an alternative embodiment, the plurality of semiconductor optoelectronic components can also be placed at dedicated positions so that a main emission area of the semiconductor optoelectronic components faces towards the drive layer. For this purpose, the drive layer has recesses at these positions so that, in plan view, each of the semiconductor optoelectronic components is arranged in such a recess, the drive layer being closer (or equidistant) to a user than the emission area of the semiconductor optoelectronic components.

Another aspect concerns the formation of a mirror surface. This is done in an embodiment in which a reflective material based in particular on silver is deposited and then a photoresist deposited thereon is patterned so that the photoresist is removed over a plurality of areas. The reflective ma-terial is then removed from the plurality of areas to create the plurality of recesses.

BRIEF DESCRIPTION OF THE DRAWINGS

Further aspects and embodiments according to the proposed principle will become apparent with reference to the various embodiments and examples described in detail in conjunction with the accompanying drawings.

DETAILED DESCRIPTION

The following embodiments and examples show different aspects and their combinations according to the proposed principle. The embodiments and examples are not always to scale. Likewise, various elements may be shown enlarged or reduced in size to emphasize individual aspects. It goes without saying that the individual aspects and features of the embodiments and examples shown in the figures can be readily combined with each other without affecting the principle of the invention. Some aspects have a regular structure or shape. It should be noted that minor deviations from the ideal shape may occur in practice, but without contradicting the inventive idea.

In addition, the individual figures, features and aspects are not necessarily shown in the correct size, nor do the proportions between the individual elements have to be fundamentally correct. Some aspects and features are emphasized by showing them enlarged. However, terms such as “above”, “above”, “below”, “below-half”, “larger”, “smaller” and the like are correctly represented in relation to the elements in the figures. Thus, it is possible to derive such relationships between the elements based on the figures.

In conventional mirrors, the problem of achieving sufficient brightness while maintaining a good mirror function is solved by arranging a display, for example in the form of an LCD display, behind a partially transparent mirror. The partially transparent mirror realizes the mirror function when the display is switched off, so that an observer can see himself in the mirror. However, if a display is desired, the light from the display must be strong enough to pass through the partially transparent mirror and to the user’s eye.

In conventional LCD displays, a pixel comprises three sub-pixels. The three sub-pixels emit, for example, red, green and blue light, in which an LCD module is usually homogeneously illuminated from the back with white light. Each sub-pixel contains an r,g,b color filter so that only red, green or blue light can be emitted. Today’s state of the art is an LED-based backlight unit with white LEDs mounted in a light guide on the side, which couple light into the light guide. In classical solutions using an LCD display, the brightness can be improved by additional backlight, but this increases the mirror di-cker and the power consumption.

Figure 1:
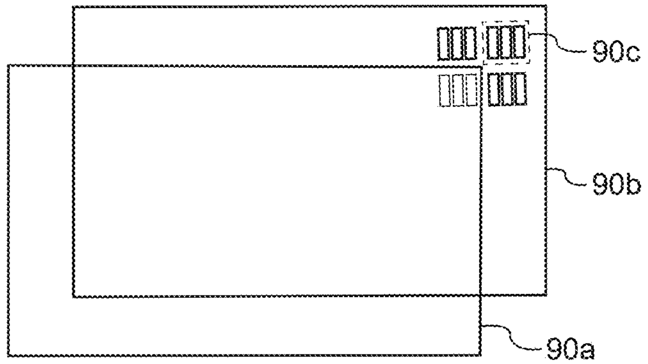
FIG. 1 shows a schematic representation of a conventional rear-view mirror screen.

FIG. 1 shows a schematic representation of a mirror in which a partially transparent mirror layer 90*a* is placed in front of a display 90*b*. The display 90*b* includes a plurality of pixels arranged in rows and columns, which in turn include three different optoelectronic components. The optoelectronic components are also referred to hereinafter in simplified form as light-emitting diodes or LEDs. In the present example, the three light-emitting diodes are designed to generate red, green and blue light, respectively, and are grouped into a pixel.

At a transmission of 30 to 50% in the visible spectral range through the partially transparent mirror layer 90*a*, the display and the light-emitting diodes 90*c* located thereon must be operated at approximately twice to 3.5 times the normal brightness in order to achieve the same brightness and visual impression for a user. The higher helicities require a greater current draw and, consequently, a higher thermal load.

The inventor now proposes to provide a mirror display in which pixels or optoelectronic components are directly arranged in recesses of a mirror matrix. Thus, the individual optoelectronic components are not located behind a partially transparent mirror layer, but in recesses within a mirror matrix.

Figure 2:
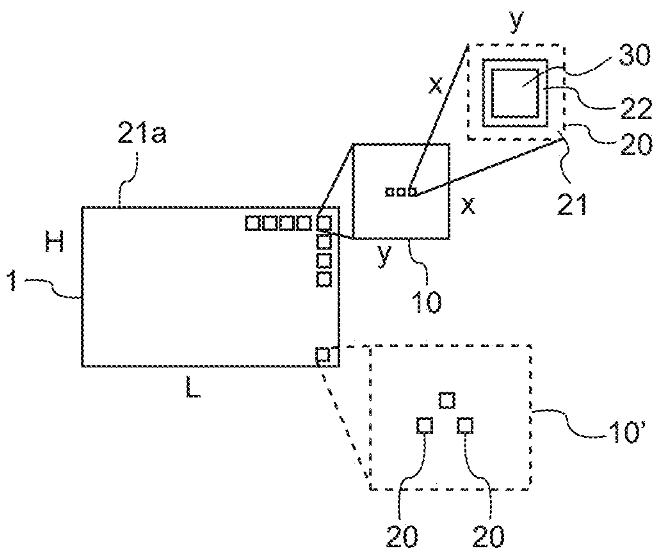
FIG. 2 shows a schematic representation of a mirror display according to the proposed principle.

A schematic drawing of such an arrangement in plan view is shown in FIG. 2. Here, the proposed mirror display comprises a length L as well as a height H with a mirror surface 21*a*. This mirror surface is constructed as a mirror matrix, and thus has mirroring areas of a mirror layer and a plurality of recesses arranged in rows and columns in this layer. These recesses may be grouped into a pixel 10 or 10' as shown, where the dimensions of the pixel are Y and X (in height), respectively. In the present embodiment, the pixels are rectangular in shape, but this is not necessarily required. Rather, depending on the geometry of the entire mirror surface 21*a*, the pixels can also be realized in different ways. In turn, each pi-xel in the present case has three subpixels for generating the colors red, green and blue. The subpixels 20 are arranged centered in the mirror surface 21*a* in plan view and formed with recesses 22.

The side length y or height x of each recess 22 is significantly smaller compared to the side length Y or height X of the pixel and may be, for example, only 1/10 of the lengths Y, X. In other words, the area of a pixel is thus about 100 times as large as a subpixel or the recess provided in the subpixel. Thus, when considered as a whole, it results in a large area of the mirror layer of the mirror surface 21*a* relative to a much smaller area of all the recesses. If, as in the illustrated embodiment, the side length of a recess is about 1/10 of the side length of a pixel, the ratio of the area of recesses 22 to the total area of a pixel 10 having a total of three subpixels is 3/100 or roughly 1/33. Such a ratio of the area of all recesses 22 in all pixels to the total area of the mirror layer is thus about 3%. In some embodiments, however, the area of all recesses can be even smaller if so-called μ-LEDs with an edge length of only a few micrometers are used as optoelectronic components 30. The number of pixels is usually expressed in ppi (pixels per inch). In the version shown in FIG. 2 with an edge length Y=X of 120 μm per pixel, the pixel density is about 211 ppi. With a side length of 20×6 cm, this would be approximately 833000 pixels.

The number and also the shape and arrangement of the recesses depend on the desired display function. For example, as shown here, the individual pixels can be arranged in rows and columns, resulting in a "normal" display with a number of pixels or pixels in rows and columns. In the case of a different mirror surface, for example in the form of a semicircle or with curved edges, the shape and positioning of the individual pixels and the optoelectronic components or the recesses 22 can also be adapted accordingly. Likewise, the entire area of the mirror surface does not have to have recesses. The mirror surface can also contain a mirror matrix and thus a display (i.e. recesses) only in a partial area, while other areas comprise a continuous mirror layer.

The mirror layer 21 itself is made of a common material, for example a silver coating, and surrounds the respective recesses. In the edge region of the recess, the mirror layer has a suitable shape, for example to reduce diffraction effects of light and thus artifacts that create a disturbing visual impression for a user. Recesses in the range of less than 10 μm can hardly be recognized by the user and only with great effort and at a small distance from the mirror layer. Because of this and because of the small area of each recess in relation to the total area, however, only the known function of the mirror layer results for a user when the display is switched off.

In the form shown here, each pixel is represented by three subpixels in the different colors, with the individual subpixels or their recesses 22 arranged in series. Thus, a pixel comprises three subpixels arranged in series. In an alternative embodiment shown in pixel 10', the subpixels 20 with their respective recesses are arranged with respect to each other in such a way that they form a kind of isosceles triangle. Thereby, each recess sits on a tip of such an isosceles triangle.

In addition to this design, it is also possible to provide further recesses per pixel so that redundant optoelectronic components can be placed there depending on the application. If required, these optoelectronic components can replace the functions of damaged components or provide additional visual information. Depending on the application, such recesses with redundant components can also be covered or provided with a reflective surface after a test of the mirror display according to the invention.

Figure 3:
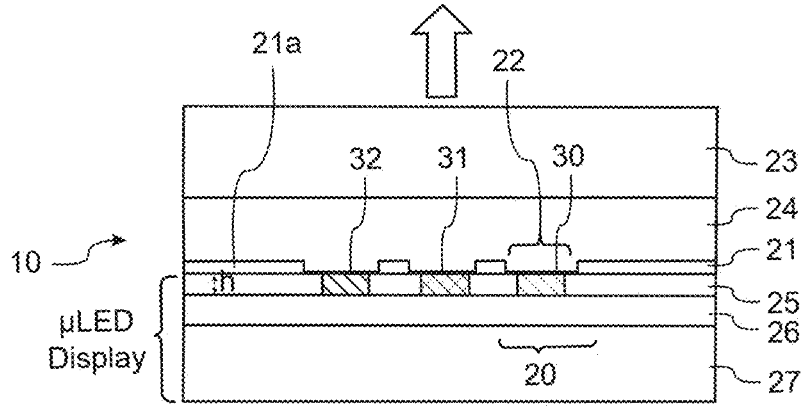
FIG. 3 is a side view of a first embodiment of the mirror display according to the proposed principle.

FIG. 3 now shows a first embodiment of the mirror display according to the proposed principle in a side view. The mirror display comprises a carrier substrate 27 on which a control layer 26 is formed in several steps in a manufacturing process. The drive layer 26 is implemented in thin-film technology and includes, in addition to possible supply lines, further electronic components such as transistors, capacitors or other elements for forming current sources and for driving the optoelectronic semiconductor components or the light-emitting diodes. Some positions on the surface of the driving layer 26 are formed as contact pads. A plurality of light emitting diodes 31 and 32 are arranged and electrically contacted on the contact pads. The light-emitting diodes 30 to 32 are designed as μ-LEDs with an edge length of only a few micro-meters.

In the present example, the light-emitting diodes are designed as horizontal light-emitting diodes so that their contact pads, i.e. the connections for anode and cathode, are located on the same side of the body of the light-emitting diodes. Alternatively, these light-emitting diodes can also be designed as vertical light-emitting diodes, in which one contact is opposite the drive layer 26 and the other contact is arranged next to or in the emission surface of the light-emitting diodes. This contact is then connected to the drive layer 26 via an electrical supply line.

The individual light-emitting diodes 30 to 32 are spaced apart from one another. A space between the light-emitting diodes is filled with an insulating planarization layer 25. The height of the planarization layer in the embodiment example is selected so that the surface of the planarization layer 25 is flush with the emission surface of the respective light-emitting diodes.

A mirror surface 21*a* with a mirror layer 21 is now applied to the planarization layer 25. The mirror layer may comprise silver or another reflecting metal as material. The mirror surface 21*a* comprises several recesses 22 in the layer 21, the size of which is annularly larger than the emission area of the respective optoelectronic components or light-emitting diodes 30 to 32. The mirror layer 21 thus directly adjoins the emission area of the light-emitting diodes 30 to 32, whereby in plan view the light-emitting diodes 30 to 32 are thus arranged in one of the respective recesses. Between the individual optoelectronic components, a partial area is also covered with the mirror layer 21, resulting in three essentially square recesses in plan view. This structure corresponds to the embodiment for a pixel shown in FIG. 2. Each of the recesses 22 with light-emitting diodes 30 to 32 arranged therein in plan view thus forms a sub-pixel.

A further planarizing and transparent protective layer 24 is now deposited on the mirror layer 21. The protective layer fills the area of the recess in which the light-emitting diodes 30 to 32 are arranged. A refractive index of the protective layer 24 can be selected in such a way that light from the light-emitting diodes 30 to 32 can be easily coupled out and into the protective layer 24.

The thickness of the protective layer 24 may be a few 10 μm to a few 100 μm. A transparent glass layer 23 is additionally implemented above the protective layer 24. The glass layer 23 serves as further protection against damage to the transparent protective layer, but can also assume additional functionalities. For example, an electrochromatic structure can be implemented in the glass layer 23 so that the mirror display can additionally be darkened in a suitable manner, for example to reduce reflection of incident light in the mirror. The protective layer 24 and also the protective glass 23 are optional, i.e. they can be omitted or designed differently, depending on the embodiment.

In the embodiment example of FIG. 3, the emission surfaces of the light-emitting diodes 30 to 32 lie substantially within the plane of the mirror layer 21 of the mirror surface 21*a*. As a result, most of the light generated by light-emitting diodes 30 to 32 is emitted upwardly, so that the light power losses are relatively small. However, depending on the refractive index jump between the protective layer 24 and the emitting surface of the light emitting diodes 30 to 32, it may lead to undesirable reflections in the boundary region. In some applications, it is therefore advisable to improve the refractive index or to provide a light guide.

Figure 4:
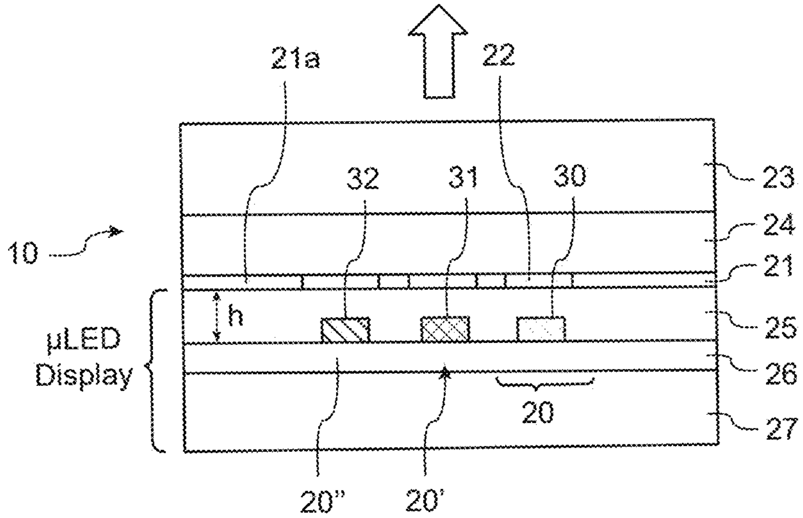
FIG. 4 is a second embodiment of the mirror display according to the proposed principle in a side view.

FIG. 4 shows an embodiment suitable for this purpose, in which the mirror surface 21*a* is spaced from the emission surfaces of the individual light-emitting diodes 30 to 32. In this embodiment, the individual light-emitting diodes for forming a sub-pixel 20, 20' and 20" are again formed on the drive layer 26 as horizontal light-emitting diodes. A planarization layer made of a transparent material completely surrounds the individual light-emitting diodes and in particular also covers their emission surfaces. The mirror surface 21*a* thus lies in front of the respective emission surfaces of the light-emitting diodes in plan view. The recesses 22 of the mirror surface 21*a* are again arranged directly above the respective light-emitting diodes. In this embodiment, in addition to the possibility of adjusting the refractive index between the emission surface of the light-emitting diodes and the protective layer 24 of the mirror display, a certain light shaping is thus also achieved. This is due to the adjustable distance of the recesses 22 from the emission surface of the respective light-emitting diodes 30 to 32.

The embodiments of FIG. 3 and FIG. 4 can be manufactured essentially in two separate and distinct steps. In a first step, the μ-LED dis-play is manufactured separately from the carrier substrate 27, the drive layer 25, the individual optoelectronic components forming the subpixels and the planarization layer 25. In a second subsequent step, the mirror surface 21*a* with the recesses and the mirror layer 21 can be applied to the planarization layer 25. It is also possible to manufacture the glass layer 23, the protective layer 24 and the mirror surface 21 separately. This part of the mirror display is then aligned with a corresponding μ-LED display and placed on it.

Figure 5:
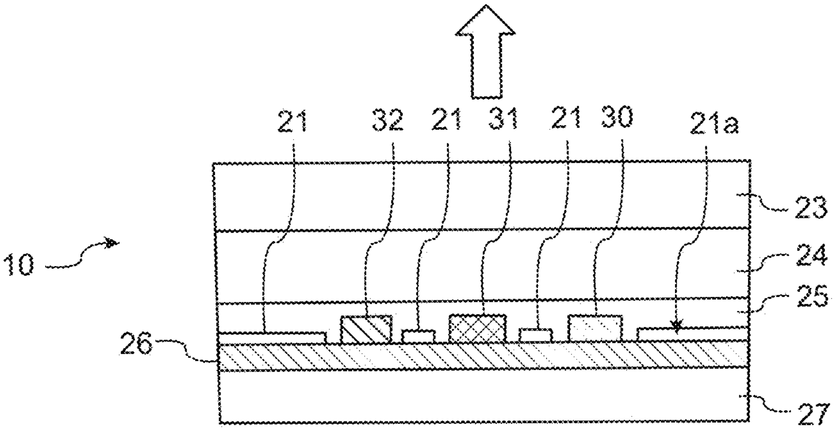
FIG. 5 is a side view of a third embodiment of the mirror display according to the proposed principle.

FIG. 5 shows a different design example. In this case, a drive layer 26 in thin-film technology is again implemented on a carrier substrate 27. A separate non-conductive layer is applied to the surface of the drive layer 26, leaving only the contact areas for the optoelectronic light-emitting diodes 30 to 32 on the drive layer free. The mirror surface 21*a* with the mirror layer 21 can now be deposited on the non-conductive layer, again leaving the contact areas for the optoelectronic components free. The optoelectronic components are thus located between the exposed contact areas in the recesses of the mirror surface 21*a*.

As shown in FIG. 5, the emission areas of the optoelectronic components are located above the mirror layer 21 in plan view. A transparent and non-conductive planarization layer 25 surrounds the mirror surface 21*a* as well as the optoelectronic components and is sealed and protected against damage by a further protective layer 24 and a glass layer 23.

In this embodiment, the μ-LED display thus comprises not only the carrier substrate 27, the drive layer 26 and the optoelectronic components located thereon, but also the mirror surface 21*a*. Such a design may be easier to manufacture depending on the application, but a user's visual impression may change due to the increased emission areas.

In particular, the recesses in all three embodiments may be visible to a user and thus have a disturbing effect with respect to a possible mirror surface. For this reason, it may be useful to additionally provide the recesses with a partially transparent mirror material in order to reduce this possibly disturbing influence.

Figure 6:
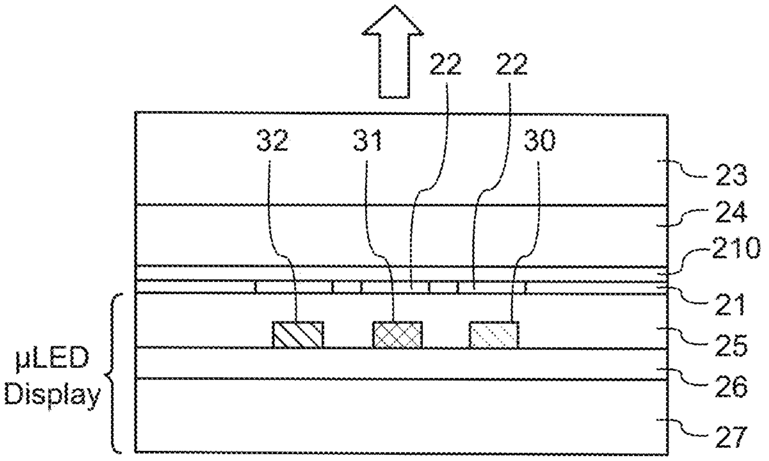
FIG. 6 shows a fourth embodiment of the mirror display according to the proposed principle in a side view.

FIG. 6 shows such an embodiment in which a partially transparent mirror 210 is additionally deposited on the mirror layer 21. The partially transparent mirror layer 210 can have a relatively high transparency in the range of 70-90%, and thus shade the recesses only slightly. This ensures that sufficient light passes through the recesses 22 and the partially transparent mirror layer 210 when the μ-LED display is in operation. Nevertheless, the partially transparent mirror layer 210 obscures the structure of the recesses 220 for a user, so that the user gets the impression of a normal mirror when the display is switched off.

The previous embodiments show a μ-LED display whose emission direction is directed away from the drive layer 26. However, it is also possible to arrange electronic components in such a way that they radiate through the drive layer. This allows a higher flexibility in the implementation, so that further application possibilities may open up.

Figure 7:
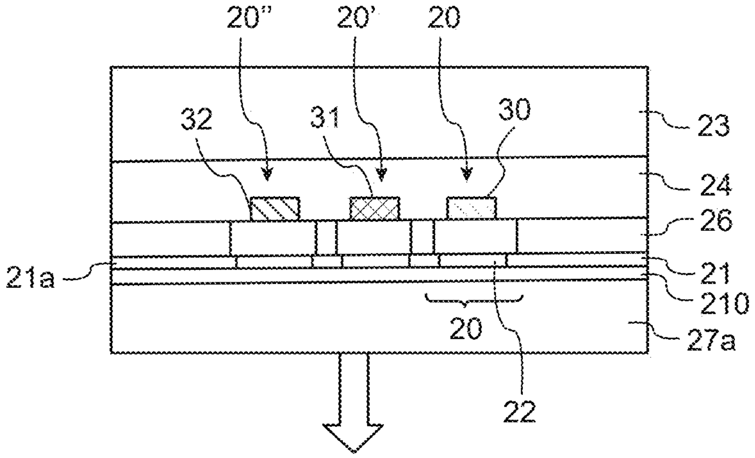
FIG. 7 shows a fifth embodiment of the mirror dis-play according to the proposed principle in a side view.
Figure 8:
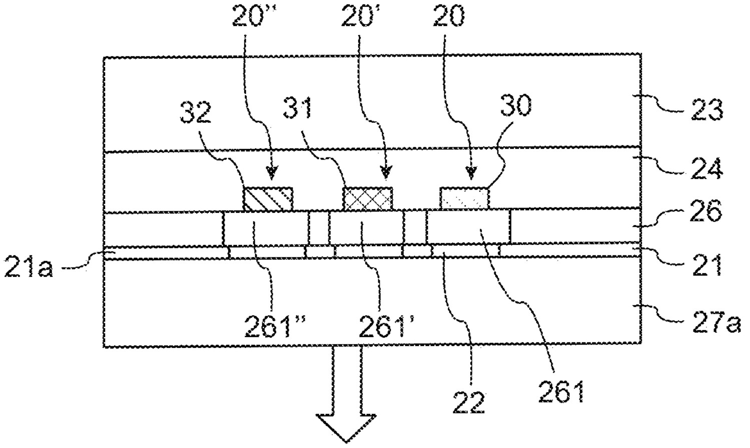
FIG. 8 shows a sixth embodiment of the mirror dis-play according to the proposed principle in a side view.

FIGS. 7 and 8 show such a configuration. In FIGS. 7 and 8, it is envisaged that the light emitted by the optoelectronic components is guided through the transparent carrier substrate 27*a*. For this purpose, as shown for example in FIG. 8, a transparent carrier substrate 27*a* is provided on which the mirror surface 21*a* with the mirror layer 21 and the recesses therein are deposited. The μ-LED display again includes a drive layer 26 in which a plurality of transparent regions 261, 261' and 261" are provided. The trans-parent regions can both be formed as openings that are optionally filled with a transparent material. The optoelectronic components in the form of μ-LEDs are now applied to these transparent areas 261, 261' and 261".

The arrangement, and in particular the μLEDs 30 to 32, are positioned in such a way that their emission surface faces the transparent areas 261, 261' and 261" and the recesses 22. In the present embodiment, the transparent areas are made larger than the respective recesses and are also made larger than the respective emission areas of the optoelectronic components. This facilitates positioning of the transparent regions in the layer 26 with respect to the recesses 22 during manufacture.

Likewise, the optoelectronic components can also be more easily placed on the transparent regions in a positionally accurate manner. In some embodiments, it is convenient to further provide the side walls of the transparent regions with a non-absorbent but reflective material. In this way, light which is emitted by the components into the transparent areas and strikes the side walls is guided in the direction of the recesses 22.

Contacting of the optoelectronic components takes place both in the transparent areas, for example through transparent conductive materials; alternatively, contacting can also take place from the side facing away from the emission surface via bonding wires. In the latter case, these leads are protected from possible damage by an additional protective layer 24. In this embodiment, an optional back carrier 23 is applied to the protective layer 24.

In operation of this arrangement, a user thus looks at the mirror surface 21*a* with its recesses 22. In plan view, the mirror surface 21*a* lies in front of the optoelectronic components and in front of the drive layer 26. The drive layer 26 is in turn arranged between the mirror surface 21 and the optoelectronic components 30 to 32. In this embodiment, the transparent carrier substrate 27*a* thus acts as an additional protective layer of the mirror display and can thus be used directly.

FIG. 7, on the other hand, shows a further slight modification. Here, similar to FIGS. 6 and 5, an additional partially transparent mirror layer 210 is applied to the mirror layer 21 in front of the mirror surface 21*a* in the viewing direction. As in the previous embodiments, the partially transparent mirror layer 210 covers both mirror layer 21 and the recesses 22 of mirror surface 21*a*. Thus, possible artifacts in the visual impression of a user are reduced by the recesses.

Figure 9:
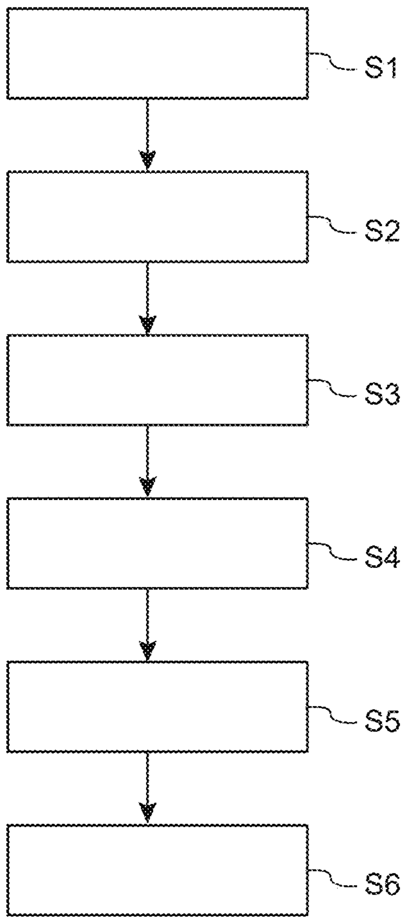
FIG. 9 is an embodiment of a method for manufacturing a mirror display according to the proposed principle.

FIG. 9 shows a possible embodiment of a process for producing a mirror display according to the proposed principle. It is understood that the proposed mirror display can be realized and manufactured in different ways. For example, it is possible to manufacture a μ-LED display with the necessary control layers and the optoelectronic components or light-emitting diodes arranged thereon separately and then to combine it with a mirror surface, whereby this mirror surface is to be positioned with its respective recesses above the corresponding optoelectronic components.

Depending on the size and number of the recesses, this can be difficult, since high demands have to be made on both the positioning and the accuracy in the manufacture and production of the recesses in the mirror surface. In some embodiments, it is therefore advisable to print the mirror surface with its recesses directly onto the μ-LED display and the planarization layer in a further manufacturing step after the μ-LED display has been manufactured. Depending on the desired application, a further protective layer and a glass layer are then applied to complete the mirror display.

In the process shown in FIG. 9, a carrier substrate is provided in step S1. In step S2, the driving layers are formed in a thin-film technique. Here, it is possible that different layers are deposited on top of each other on the carrier substrate to generate the respective electronic function. Alternatively, such a drive layer can also be produced separately in step S2 and applied to the carrier substrate provided in step S1 by means of a transfer process.

In addition to electronic leads, the drive layer also comprises one or more electronic components, for example resistors, capacitors or also transistors. These form a controllable current source, for example, so that the control layer can supply the necessary supply current for the respective optoelectronic components. Further circuits in the drive layer can contain compensation circuits to reduce leakage currents or to compensate for possible process fluctuations in the manufacture of the TFTs or to compensate for the slightly different turn-on voltages of the LEDs. The drive layer in step S2 is manufactured in a material system which is at least partially different from a material system of the optoelectronic components. Silicon, which can be processed both crystalline and amorphous to form such drive layers, is particularly suitable as a technology carrier for thin-film technology. Several contact pads are implemented on the drive layer. Layers with IGZO-based TFT structures can also be used as an alternative to LIPS. Meanwhile, there are also combinations of the two, which are referred to as LTPO-TFT.

In step S3 of the proposed method, optoelectronic components are deposited on the contact pads of the drive layer and electrically contacted with them. In some embodiments, a first functional test of the drive layer with the optoelectronic components located thereon is also carried out here, in order to identify and replace, for example, damage in the drive layer as well as faulty contacts or faulty components. This makes it possible to place replacement components on redundant contact pads in the event of incorrectly identified components.

After such an optional functional test, a planarization layer surrounding the optoelectronic components is deposited in step S4. Depending on the design, the thickness or height of the planarization layer is chosen such that it suitably ends approximately at the level of the emission area of the optoelectronic components, so that a substantially smooth and stepless surface is produced. Alternatively, the planarization layer may also cover the emission surface so that the light-emitting diodes and optoelectronic components are completely enclosed by the planarization layer. In further optional grinding or polishing steps, the material of the layer is planarized and prepared for deposition of a silver layer.

Subsequently, in step S5, a mirror surface is applied to the planarization layer. This can be done in two ways, for example.

In a first option, a thin mirror layer with a thickness of a few nanometers or micrometers is applied over the entire surface of the planarization layer. Subsequently, a photoresist is applied, whereby the later recesses are left out of the photoresist. After exposure of the photoresist, the parts not covered by the photoresist are removed again, so that recesses are formed in the mirror surface. This variant is useful if the display is not to be transferred to form the mirror surface with the respective recesses, since the exact knowledge of the position of the individual optoelectronic components can be used for the step of applying and exposing the photoresist.

In an alternative way of forming a mirror surface, a photoresist or other material is deposited over areas of the planarization layer that forms the later recesses. A flat mirror layer is then applied again and the photoresist and the mirror material are removed again above the photoresist. In both cases, a mirror surface remains which has recesses in the position above the optoelectronic components.

After such a fabrication, the μ-display thus produced and provided with a mirror surface can be transferred and further processed in step S6. For this purpose, a transparent protective layer is deposited on the mirror surface so that both the mirror surface and the optoelectronic components located therein in the recesses are protected against damage. Finally, the mirror display is provided with a glass layer that is resistant to contact and scratches in order to further protect the mirror from possible damage. Furthermore, an electrochromatic structure can optionally be provided in the glass layer, for example to generate a dimming function in case of incident light reflected by the mirror layer.

In another embodiment of a process, a carrier substrate is provided and a mirror surface with recesses is formed thereon. Such a mirror surface can be formed in a manner similar to that described above. A thin insulating layer is applied to the mirror surface formed in this way. Only then is the control layer formed. The control layer comprises transparent areas that lie above the recesses in the mirror surface.

Here, too, it is possible to manufacture the control layer separately and then position it appropriately on the insulating layer. Likewise, the drive layer can be produced directly on the insulating layer. After forming or applying the same, optoelectronic components are placed on the transparent areas of the drive layer and electrically contacted with the drive layer.

In step S3, however, in contrast to the previous example, the optoelectronic components are provided in such a way that they radiate through the transparent areas in the drive layer. The radiation direction of the optoelectronic components compared to the previous process example is thus reversed and corresponds to the embodiments of FIGS. 7 and 8. The transparent areas in the drive layer are manufactured during the production of the drive layer and comprise, for example, openings which are filled with a transparent material. Alternatively, openings can be provided into which the optoelectronic components are directly inserted in order to be subsequently connected to the drive layer from the rear side via bonding wires. In such an embodiment, the components are thus located in areas of the drive layer.

The embodiments of a mirror display shown here can be combined in various ways without this being detrimental to the idea of the invention. In contrast to conventional solutions, the production of a mirror display, in particular with μ-LED technology, allows a high luminance to be achieved on relatively small areas while at the same time keeping the heat load low. This makes it possible to implement optoelectronic components in the form of pixels for generating an image directly in a mirror surface without significantly affecting the functionality of the mirror surface.

For a user, the mirror display according to the proposed principle thus offers the possibility to use it in its mirror function as well as in a display function. The production of the proposed mirror display does not differ significantly from the production of conventional mirrors, so that in particular further functions such as a dimming function can be realized in such a mirror display. In particular, the formation of partially transparent mirrors can be dispensed with depending on the desired application, or such a partially transparent layer can be designed with a significantly higher transmittance than is the case in conventional mirrors. This further reduces the thermal load on the light-emitting diodes, since sufficient brightness for a user can also be achieved with such a mirror layer.

REFERENCE LIST

1 integrated μ-LED mirror display
10 pixels
20 subpixel
20', 20" subpixel
21 mirror layer
21*a* mirror surface
22 recess
23 protective glass
24 protective layer
25 planarization layer
26 TFT layer, drive layer
27 substrate
30 optoelectronic component, μ-LED
90*a* mirror layer
90*b* display
90*x* pixel
210 partially transparent mirror layer
261 transparent area
261' transparent area
261" transparent area

The invention claimed is:

1. A mirror display comprising:

a mirror surface having a mirror layer comprising a plurality of spaced apart recesses; and a plurality of optoelectronic components disposed on a drive layer comprising at least leads for driving the optoelectronic components of the plurality of optoelectronic components, wherein the mirror layer is arranged in an electrically insulated manner on the drive layer, in a top view of the mirror surface, in each case at least one optoelectronic component of the plurality of optoelectronic components is arranged in a recess of the plurality of spaced apart recesses, an emission surface of the at least one optoelectronic in the recess of the plurality of spaced apart recesses projects beyond the mirror surface, and in plan view, the optoelectronic components of the plurality of optoelectronic components arranged in the recesses of the plurality of spaced apart recesses are located behind the mirror layer of the mirror surface.

2. The mirror display according to claim 1, wherein the recesses of the plurality of spaced apart recesses correspond to the optoelectronic components of the plurality of optoelectronic components, or three optoelectronic components of the plurality of optoelectronic components are arranged in the recesses of the plurality of spaced apart recesses.

3. The mirror display according to claim 1, in which a total area of all recesses of the plurality of spaced apart recesses is less than half an area of the mirror surface.

4. The mirror display according to claim 1, wherein three mutually adjacent optoelectronic components of the plurality of optoelectronic components each form a pixel of the mirror display, and each optoelectronic component in the pixel is adapted to emit a color.

5. The mirror display according to claim 1, wherein, in plan view, the optoelectronic components of the plurality of optoelectronic components arranged in the recesses of the plurality of spaced apart recesses lie at least partially in a plane of the mirror surface.

6. The mirror display according to claim 1, wherein an emission area of the at least one optoelectronic component in the recess of the plurality of spaced apart recesses is smaller than an area of the recess of the plurality of spaced apart recesses.

7. The mirror display according to claim 1, further comprising at least one of:

a transparent filler material that at least partially fills at least one recess of the plurality of spaced apart recesses such that a surface of the mirror layer is planarized;

a partially transparent mirror layer disposed on the mirror layer and the recesses of the plurality of spaced apart recesses in plan view;

a transparent protective layer arranged in front of the mirror surface in plan view; or a transparent protective layer arranged in front of the mirror surface in plan view, and a protective glass arranged in front of the mirror surface and the transparent protective layer in plan view.

8. The mirror display according to claim 1, further comprising a supporting substrate on which the driving layer is deposited.

9. The mirror display according to claim 1, in which the optoelectronic components of the plurality of optoelectronic components are formed with μ-LEDs whose edge length is less than 70 μm.

10. The mirror display according to claim 1, in which the drive layer comprises a plurality of electronic components in thin-film technology for supplying the optoelectronic components of the plurality of optoelectronic components.

11. The mirror display according to claim 1, wherein the recesses of the plurality of spaced apart recesses are arranged in rows and columns.

12. The mirror display according to claim 11, wherein three recesses of the plurality of spaced apart recesses are grouped in a first group such that a distance between the recesses in the first group is less than a distance from an adjacent second group of three recesses of the plurality of spaced apart recesses.

13. The mirror display according to claim 1, further comprising a planarization layer on which the mirror layer is deposited and which is arranged between the optoelectronic components of the plurality of optoelectronic components.

14. The mirror display according to claim 13, wherein the planarization layer extends over the optoelectronic components of the plurality of optoelectronic components.

15. The mirror display according to claim 1, wherein the driving layer is arranged in a top view on the mirror surface between the mirror surface and the optoelectronic components of the plurality of optoelectronic components.

16. The mirror display according to claim 15, wherein the driving layer comprises a plurality of transparent areas or openings corresponding to the recesses of the plurality of spaced apart recesses in a top view of the mirror surface.

17. The mirror display according to claim 15, further comprising a transparent support substrate arranged in front of the mirror surface in plan view thereof, and the mirror layer applied thereto.

18. A mirror display comprising:

a mirror surface having a mirror layer comprising a plurality of spaced apart recesses; and a plurality of optoelectronic components disposed on a drive layer comprising at least leads for driving the optoelectronic components of the plurality of optoelectronic components, wherein the mirror layer is arranged in an electrically insulated manner on the drive layer, in a top view of the mirror surface, in each case at least one optoelectronic component of the plurality of optoelectronic components is arranged in a recess of the plurality of spaced apart recesses, an emission surface of the at least one optoelectronic in the recess of the plurality of spaced apart recesses projects beyond the mirror surface, and three mutually adjacent optoelectronic components of the plurality of optoelectronic components each form a pixel of the mirror display, and each optoelectronic component in the pixel is adapted to emit a color.

19. A mirror display comprising:

a mirror surface having a mirror layer comprising a plurality of spaced apart recesses; and a plurality of optoelectronic components disposed on a drive layer comprising at least leads for driving the optoelectronic components of the plurality of optoelectronic components, wherein the mirror layer is arranged in an electrically insulated manner on the drive layer, in a top view of the mirror surface, in each case at least one optoelectronic component of the plurality of optoelectronic components is arranged in a recess of the plurality of spaced apart recesses, an emission surface of the at least one optoelectronic in the recess of the plurality of spaced apart recesses projects beyond the mirror surface, the recesses of the plurality of spaced apart recesses are arranged in rows and columns, and three recesses of the plurality of spaced apart recesses are grouped in a first group such that a distance between the recesses in the first group is less than a distance from an adjacent second group of three recesses of the plurality of spaced apart recesses.

* * * * *